US006752652B1

(12) United States Patent
Robinson

(10) Patent No.: US 6,752,652 B1
(45) Date of Patent: Jun. 22, 2004

(54) WATTHOUR METER SOCKET ADAPTER

(75) Inventor: Darrell Robinson, Highland, MI (US)

(73) Assignee: Ekstrom Industries, Inc., Farmington Hills, MI (US)

( * ) Notice: Subject to any disclaimer, the term of this patent is extended or adjusted under 35 U.S.C. 154(b) by 0 days.

(21) Appl. No.: 10/405,522

(22) Filed: Apr. 2, 2003

(51) Int. Cl.[7] .............................................. H01R 33/945
(52) U.S. Cl. ....................................................... 439/517
(58) Field of Search ................................. 439/517, 508, 439/638, 719, 745, 747, 856, 733.1; 361/111, 118, 102, 127, 661–663, 664–665, 659, 668

(56) References Cited

U.S. PATENT DOCUMENTS

| | | | | |
|---|---|---|---|---|
| 4,353,610 A | * | 10/1982 | Deters | 439/510 |
| 5,385,486 A | * | 1/1995 | Robinson et al. | 439/517 |
| 5,423,695 A | * | 6/1995 | Robinson et al. | 439/517 |
| 5,590,179 A | * | 12/1996 | Shincovich et al. | 379/106.06 |
| 5,704,804 A | | 1/1998 | Robinson et al. | |
| 5,997,347 A | | 12/1999 | Robinson et al. | |
| 6,200,158 B1 | * | 3/2001 | Robinson | 439/517 |
| 6,231,360 B1 | * | 5/2001 | Horie | 439/159 |
| 6,428,350 B1 | * | 8/2002 | Robinson et al. | 439/517 |
| 6,443,761 B1 | | 9/2002 | Robinson et al. | |
| 6,488,535 B1 | * | 12/2002 | Robinson et al. | 439/517 |
| 6,520,798 B1 | * | 2/2003 | Robinson et al. | 439/517 |
| 6,549,388 B2 | * | 4/2003 | Robinson | 361/111 |
| 6,589,072 B2 | * | 7/2003 | Robinson et al. | 439/517 |
| 6,592,399 B2 | * | 7/2003 | Robinson et al. | 439/517 |
| 6,663,405 B1 | * | 12/2003 | Robinson et al. | 439/188 |

OTHER PUBLICATIONS

Ekstrom Industries, Inc., *Ekstrom Product Presentation 38 Series*, Bulletin #3801, Aug. 1, 1975.
Marwell Corporation, *E–Z 1800 Series Extender Adapters*, Product Catalog, pp. 4–5.

* cited by examiner

*Primary Examiner*—P. Austin Bradley
*Assistant Examiner*—Phuongchi Nguyen
(74) *Attorney, Agent, or Firm*—Young & Basile, PC

(57) ABSTRACT

A watthour socket adapter base carries jaw blades for receiving blade terminals on a meter device and connectable to meter socket jaw contacts. Latch member carrier by drive members on an annular ring engage a socket cover to fixedly mount the latch base to the socket cover. Barriers surround each drive member to electrically insulate the drive members from the jaw contacts. Apertures in the base are surrounded by strain relief and lock fingers to accommodate the passage of conductors throgh the base. Conformable discontinuities are formed in the annual ring of the base to conform to different diameter shells attachable to the base. In another aspect, the latch members are pivotally mounted on an outer surface of the base and movable between latching and unlatching positions by rotation of a fastener extendible through the shell and the base and engaged with the latch members.

64 Claims, 14 Drawing Sheets

WATTHOUR METER SOCKET ADAPTER

BACKGROUND

The present invention relates, in general, to watthour meters and meter sockets and, more specifically, to watthour socket adapters or extender adapters for mounting, recording and other instrumentation equipment on ringless style watthour meter sockets.

In the electric utility industry, plug-in, socket-type watthour meters are commonly employed to measure electric power consumption at a residential or commercial building establishment. A socket is mounted on a wall of the residence or building and contains terminals which are connected to electric line and electric load conductors. The terminals are also connected to internal conductors within the socket which extend to jaw contacts positioned to receive the blade terminals of a plug-on watthour meter to complete an electric circuit through the watthour meter between the line and load terminals and the conductors.

One type of meter socket has a ring-type cover which includes an outwardly projecting, annular mounting flange surrounding an opening in the cover through which the blade terminals of a watthour meter extend. The mounting flange is sized to mate with a complementary formed mounting flange on the base of the watthour meter. The two mating mounting flanges are held together by a sealing ring.

Another type of meter socket has a ringless style cover which has only a slightly raised boss surrounding an aperture in the cover. The meter and/or socket adapter is connected to the jaw contacts in the socket and has an end portion which extends through the aperture.

While a socket adapter can be easily attached to either meter socket cover style for receving a plug-in watthour meter, it is necessary sometimes to connect load survey equipment or recording equipment to the meter socket for various study and reporting surveys. Since such equipment is frequently contained in a housing which is too large to pass through the aperture in the socket cover or to be connected to the mounting flange in a ring style cover for connection to the socket jaw contacts, latch base socket adapters have been devises which include the standard jaw blades for receiving blade terminals in the survey equipment in a plug-in connection, with ends of the jaw blades passing through the latch base for plug-in connection to the socket jaw contacts. Such a latch base includes lock members which are engagable exteriorly of the socket cover to move latch fingers behind the latch cover to securely mount the latch base to the socket cover on a meter socket.

One prior art approach to providing a latch base socket extender adapter is shown in FIGS. 1A and 1B. This extender adapter is modeled after Ekstrom Industries, Inc., 38 series extender adapter and is formed of a two-part base and shell. The base, shown in FIG. 1A, has a circular cross section formed of a bottom wall, a radially outward extending mounting flange and a short length side wall. A plurality of apertures extend through raised bosses on the base wall and the base wall for receiving the blade end of jaw blades shown in FIG. 1B mounted through the shell and base for interconnection with the socket jaw contacts.

A plurality of mounting screw bosses are disposed internally of an annular ring concentric within the mounting flange and extending from the base wall. The bosses receive mounting screws to which an L-shaped, steel latch flange is attached. The bosses guide movement of the L-shaped latch flange as the screws are threaded in and out relative to the base. Such movement of the screws bidirectionally extends a lower leg of the latch flange mounted around each screw underneath the adjoining raised boss on the ringless socket cover to fixedly attach the base to the metal surrounding the opening in the cover. Since the heads of the screws are disposed externally of the side wall of the base as part of a cast metal ring mounted around the side wall of the base on one side of the mounting flange, the base end of the extender adapter can be mounted through the opening in the ringless socket cover after the cover has been installed on the meter socket.

Bore are cross drilled in the screw heads for receiving a meter seal which extends through an adjacent aperture in an ear formed on the metal ring after the screws have been threaded to their fully latched position.

The shell has a bottom wall and a side wall extending therefrom to an external mounting flange mateable with complimentary mounting flanges on load survey recording equipment or other metering instrumentation. Bosses in the shell support the jaw blades which pass through the bottom wall of the shell and the bottom wall of the base for connection at a blade end with the socket jaw contacts. The shell is fixedly attached to the base by screws which extend through apertures in the bottom wall of the shell into bores formed in mounting bosses in the base as shown in FIGS. 1A and 1B.

While such an extender adapter proves an effective means to install load survey recorders and other types of meter recording equipment or instrumentation on ringless style sockets, it is difficult to reliably seal the shell to the base which can lead to corrosion. Further, as shown in FIG. 1A, the interior ends of the screws are disposed in close proximity to the jaw blades extending between the bottom wall of the shell and the bottom wall of the base. This creates an arcing potential. Further, there is no capability for accommodating a watthour meter having an external accessory box or an external wire which needs to be routed through the socket adapter into the meter socket.

A different approach to a latch base type socket adapter is one sold by Marwell Corporation as Model No. E/Z 1800. In this socket extender adapter, the cast ring and screw head seal ears are integrally molded as part of the short side wall of the base which has a double thickness compared to the latch base socket extender adapter shown in FIGS. 1A and 1B. The inside pocket surrounding the inner end of each screw has one higher length wall at a radially inner end. However, the other two side walls remain short exposing the metal screw and the latch flange to arcing potential from adjacent jaw blades.

This design also presents difficulties inadequately sealing the shell to the base which can lead to corrosion. Further, the close proximity of the screw seal ears and the screw heads prevents the use of the popular Plastic Padlock Seal sold by E.J. Brooks Company, Livingston, N.J.

In both latch base adapters shown in FIGS. 1A, 1B and 2, the mounting screws are retained in the base by means of roll pins inserted through holes drilled in the enlarged bosses on the ring and into an annular recess formed in each screw. Such roll pin captures a screw relative to the ring while allowing the screw to rotate to move the attached latch member between the latched and unlatched positions. However, the drilling of the holes in the ring for each roll pin and the mounting of the roll pins in the holes requires additional assembly steps and time which increase the cost of these prior latch base adapters.

Another deficiency of the prior art latch base adapters shown in FIGS. 1A, 1B and 2 is that only, wire tamper indicating seals can be mounted through the screw heads and the ears for flanges on the ring to indicate that screws are in their final, latch engaged position without tampering or attempts to remove the latch base from the socket cover.

Thus, it would be desirable to provide a latch base watthour meter socket extender adapter which overcomes the problems associated with previously devised latch base socket extender adapters. It would also be desirable to provide a latch base socket extender adapter which has the mounting ring, base wall screws and latches formed as a one-piece assembly, which can accommodate different diameter shells so as to eliminate the need for a shell to base seal, which fully encapsulates the interior end of the mounting screws for high arc resistance, which accommodates seals for the mounting screws, which can easily accommodate a conventional watthour meter sealing ring, which has a frangible mounting flange to adapt to ring style socket covers with varying opening mounting rings, which has gas vent and external wire passage, strain relief apertures and, finally, or which has optional top and bottom swing latches to provide an internal mounting connection to a meter socket cover. It would also be desirable to provide a latch base socket extender adapter which can receive a meter sealing ring which encompasses the drive member or screw heads to prevent any unauthorized access to the mounting screws in an attempt to unauthorizedly remove the latch base from the socket cover. It would also be desirable to provide a latch base socket extender adapter which has a reduced manufacturing cost as compared to prior art latch base adapters by eliminating the need for the prior art use of roll pins and holes in the ring.

Watthour meter socket adapters in general which are formed of a base and a shell, either integrally formed or separately attachable and which are mountable in a watthour meter socket through an aperture in a ringless style meter socket cover or to a mounting flange on a ring style cover have some of the same deficiencies noted above for latch base adapters.

It is difficult to easily pass flexible conductors or wires from the watthour meter though the adapter to equipment mounted in the meter socket. In addition, it is still necessary to accommodate a sealed fit between the separate base and shell. Further, ring style socket adapters and ringless style socket adapter still require two different adapters.

Thus, it would be desirable to provide a watthour meter socket adapter which overcomes these deficiencies.

SUMMARY

The present invention is watthour meter socket adapter. In one aspect of the invention, the socket adapter has a latch base which is mountable through the aperture in a meter socket cover to enable metering devices, such as load survey recorders, etc., to be temporarily connected to the jaw contacts in the meter socket.

The inventive latch base adapter includes a housing having a base with the flange extending radially outward from the base. An annular ring extends from the base and the flange and carries a mounting flange at an outer end. A plurality of drive members, such as screw fasteners, are radially extendable thorough the ring. A latch is coupled to each drive member for movement into engagement with the meter socket cover adjacent to an aperture in the cover.

In one aspect of the invention, conformable means in the form of at least one annular discontinuity, is carried on the annular ring for adjusting the engagement of the ring with a shell attachable to the housing. In another aspect, trap members are carried in the housing for axially capturing the drive members to enable the drive members to rotate without axial movement relative to the annular ring. The trap members include a wall extending from the housing and having at least one edge angled with respect to the longitudinal axis of the drive member. The edge of the wall cooperates with a recess carried on each drive member to prevent axial displacement of the drive member during rotation of the drive member.

In another aspect of the invention, each latch member has at least one projection which engages the ring on full outward positioning of the latch and causes a lever action to be exerted on the latch member to drive the other leg of the latch member into tight engagement with the cover to mount the latch base of the adapter to the socket cover.

In another aspect of the invention, at least one seal member is carried on each drive member for environmentally sealing each drive member to the annular ring. The seal member may be mounted in an annular recess carried on each drive member.

In another aspect of the invention, the flange extending from the base of the housing includes frangible means for enabling an outer ring portion of the flange to be separated from the remainder of the flange to conform a single latch base design for use on both ring style and ringless style meter socket covers.

In another aspect of the invention, barrier means are carried in the housing for electrically insulating each drive member from adjacent electrically conductive elements in the housing. The barrier means encompass substantially all sides of the drive member projecting interiorly of the annular ring. The barrier means may be combined with the trap members so that the trap members are carried on the barrier means to provide both axial capturing and insulating features.

In another aspect of the invention, at least one flange is carried on and extends radially outward from the annular ring on the housing. An aperture is formed in the flange and is alignable with an aperture formed in the head portion of the drive member exteriorly of the annular ring. A seal indicator, such as a wire lead seal or meter padlock seal is extendable thought the aligned apertures to indicate a sealed position of the drive member. In another aspect, one edge of the flange is spaced from the flange in the housing and defines a recess for receiving one portion of a sealing ring mountable about the flange and the drive member.

In another aspect of the invention, a plurality of ribs are formed on the annular ring. The ribs have a tapering outer edge to center the shell with respect to the housing. This eliminates the need for a silicone seal used in the prior art to seal the shell to the base.

In another aspect of the invention, at least one and preferably a plurality of apertures are formed through the base of the housing. A plurality of resilient fingers are formed in the base and extend from the aperture. Each finger has a free end located at the aperture to form a strain relief for an electrical conductor passing through the aperture into the meter socket. The apex edge of the free end of each finger is bendable from the plane of the base to lockingly engage the conductor extending through the aperture and to prevent the conductor from easy withdrawal through the aperture.

In another aspect of the invention, a plurality of latch members are carried on the base of the housing and movable between a first retracted position allowing insertion of the housing through an aperture in a socket cover, and a second extended position to fixedly latch the housing to the cover. The fastener is extendable through the housing and one latch member. The latch member is mounted on the fastener so as to be rotatable with the fastener. In one aspect, the fastener is the same fastener used to mount the shell to the mounting flange of the housing.

The electrical power service apparatus in the form of a meter socket adapter with a latch base overcomes many of the difficulties encountered with previous watthour meter socket adapter latch base designs.

The conformable wall of the annular ring allows the ring on the base to accommodate different diameter shells for easy manufacturing and versatility in application of the inventive latch base.

In another aspect, the barrier means completely electrically insulates the conductive portions of the latch drive members, typically the screw fasteners, from adjacent electrically conductive jaw contacts or jaw blades in the housing to provide a high arc resistance.

The unique provision of openings in the latch base with resilient edges provides strain relief for the passage of conductors through the latch base to the meter socket.

The arrangement of the drive member head and the adjacent flange on the annular ring formed as one piece with the latch base enables the use of the inventive latch base with both ring style and ringless style meter socket covers. In addition, conventional watthour meter socket sealing rings may be uniquely mounted over the head and the flanges of each latch drive members to encompass the latch drive members in the latch engagement position and prevent access to the drive members during an unauthorized attempt to remove the latch base from the socket cover.

In another aspect of the invention, the base wall mounting end is conformable in diameter to mate with different diameter shells so as to eliminate the need for a separate, low reliability, silicone shell to base environmental seal.

In another aspect, the ear or flanges on the base ring and the slots through the latch drive member heads are configured to accommodate any conventional meter seal device, such as a plastic pad lock seal or wire lead seal.

In another aspect, optional latch members used by themselves or in combination with the aforementioned latch drive members are mountable on the rear outer surface of the latch base and are pivotal between latching and unlatching positions to releasably affix the latch base to a meter socket cover. Preferably, the fasteners used to attach the shell to the base extend through the base and are engagable with the latch members for moving the latch members between the latched and unlatched positions.

In another aspect of the invention, the socket adapter includes a base and a shell which are joined together by fasteners. The conformable means described above carried on the annular ring of the base for adjustably accommodating the sealed engagement of the base with the shell can be advantageously employed for many other watthour meter socket adapters, not just latch base socket adapters.

In another aspect, the frangible rim described above may also be employed in other types of watthour meter socket adapters to enable an outer portion of the mounting flange to be separated from the remainder of the flange to conform the watthour meter socket adapter base for use on both ring style and ringless style meter socket covers.

In another aspect, at least one and preferably a plurality of apertures are formed in the base of the socket adapter. A plurality of resilient fingers are formed in the base and extend from each aperture. Each finger has a free end located at the aperture to form a strain relief for an electrical conductor passing through the aperture into the interior of the meter socket. The apex edge of the free end of each finger is bendable from the plane of the base to lockingly engage the conductor extending through the aperture to prevent the conductor from easy withdrawal from the aperture.

In yet another aspect, a plurality of latch members carried on one surface of the base, which are described above, may be employed for mounting a conventional watthour meter socket adapter base to a meter socket cover. The latch members are movable between a first retracted position allowing insertion of the socket adapter housing through an aperture in the socket cover to a second extended position to latch the socket adapter base to the socket cover. The fastener extendible through the shell and base of the housing to connect the shell and base together also receives one latch member to enable the latch member to be rotatable with rotation of the fastener.

BRIEF DESCRIPTION OF THE DRAWING

The various features, advantages and other uses of the present invention will become more apparent by referring to the following detailed description and drawing in which.

DETAILED DESCRIPTION

Figure 1A:
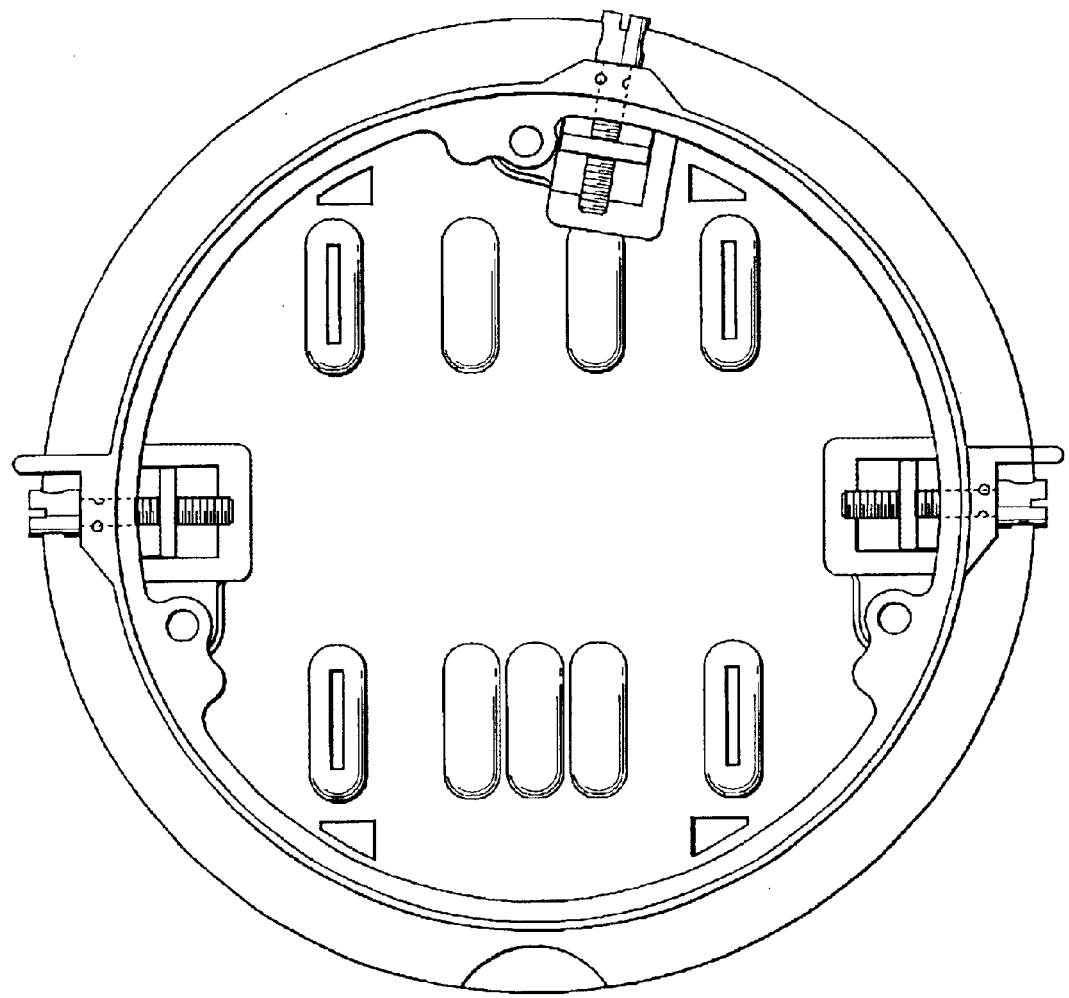
FIG. 1A is a front elevational view of a latch base used in a poor art latch base watthour meter socket extender.
Figure 1B:
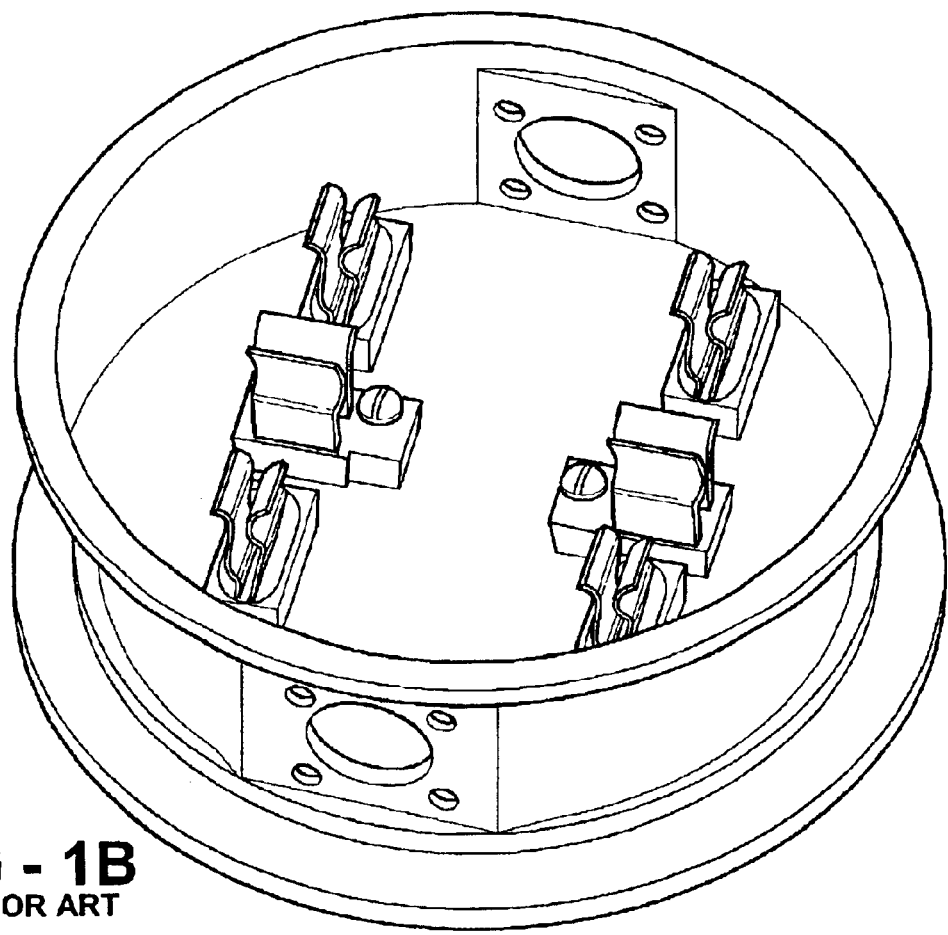
FIG. 1B is a front perspective view of the prior art latch base in FIG. 1A depicted connected to a shell and mounted in a ringless style watthour meter socket cover.
Figure 2:
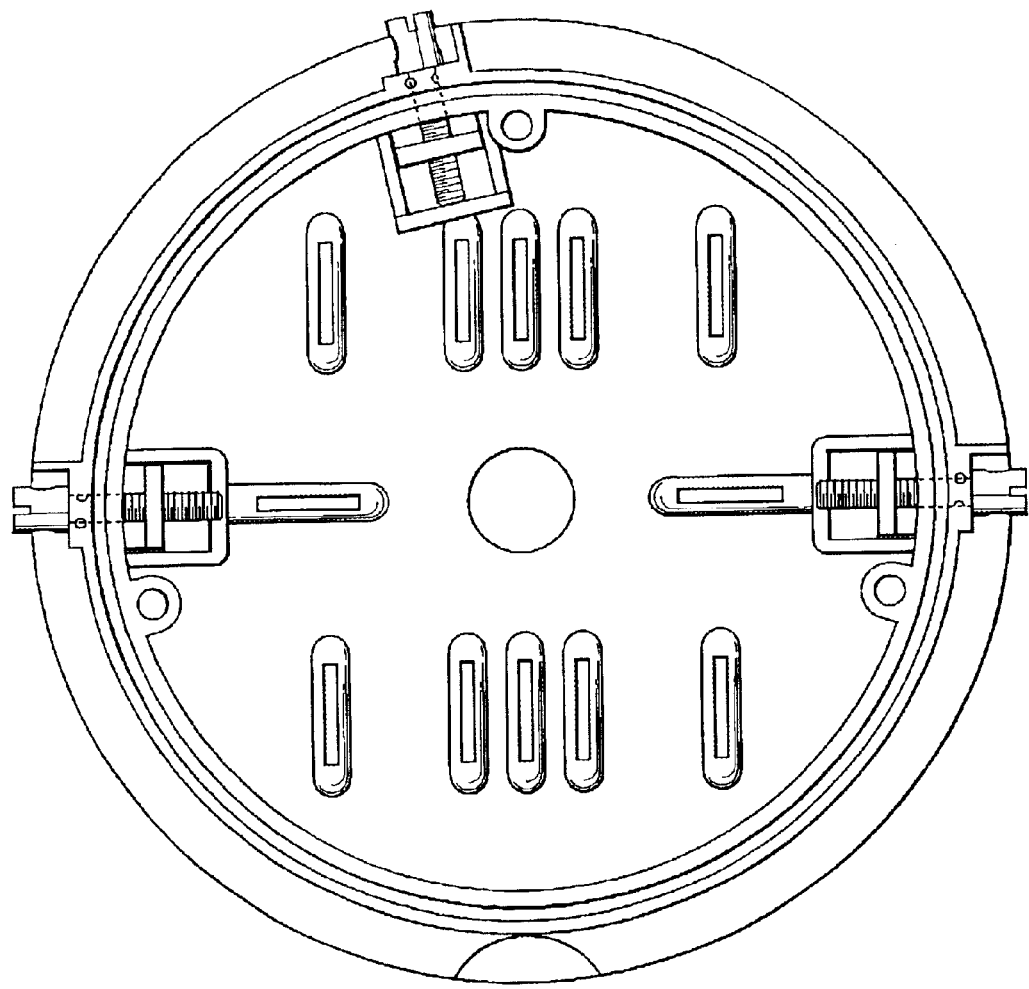
FIG. 2 is a front elevational view of another prior art latch base watthour meter socket extender.
Figure 3:
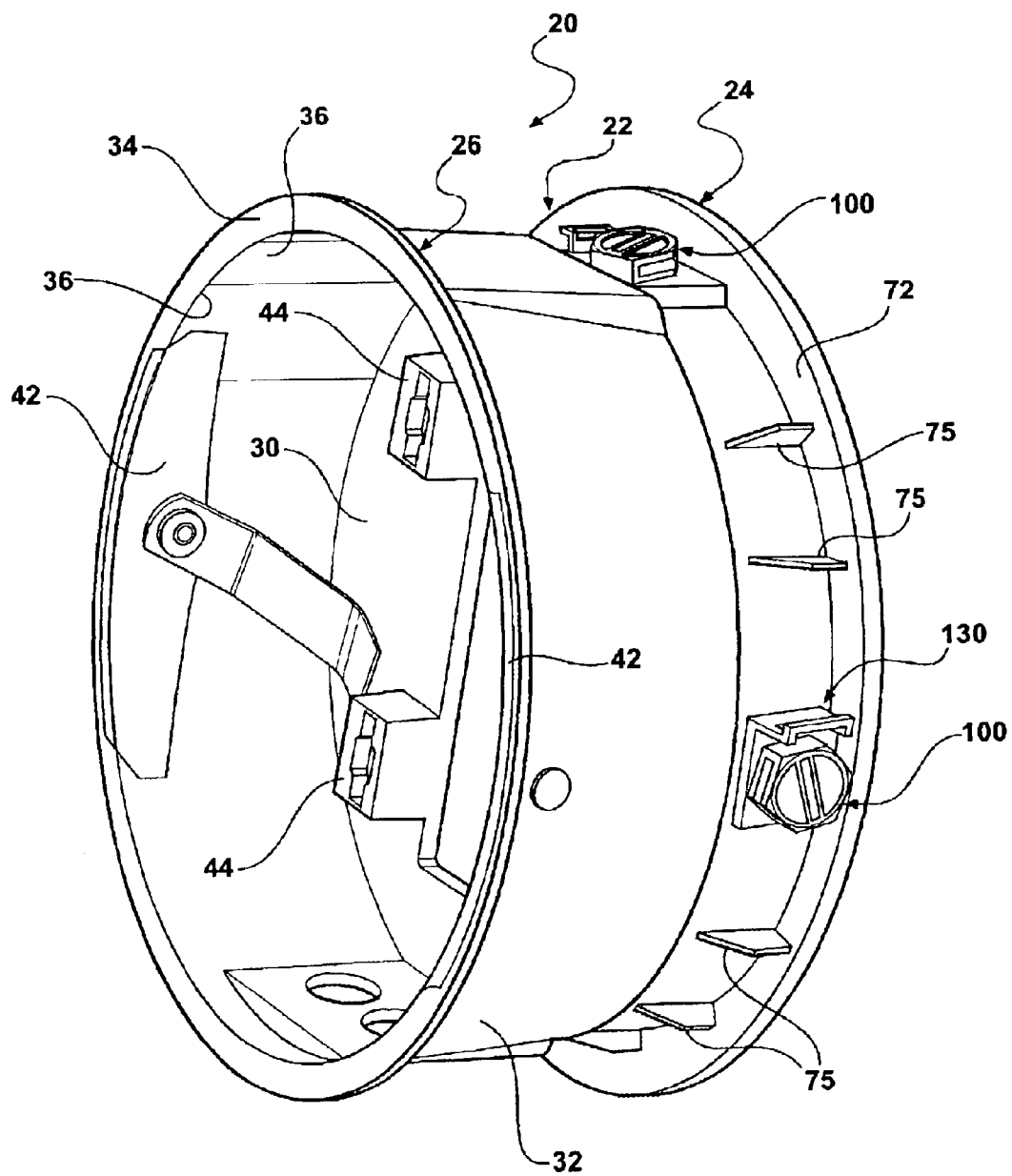
FIG. 3 is perspective view of a latch base watthour meter socket extender adapter according to one aspect of the present invention.

Referring now to the drawing, and to FIGS. 3–10 in particular, there is depicted a watthour meter socket extender adapter 20 hereafter referred to simply as the "adapter 20." The adapter 20 includes a housing 22 formed of a base 24 and a shell 26.

The shell 26 is conventionally constructed of an electrically insulated material such as polycarbonate, and has a bottom wall 30 and a side wall 32 extending therefrom. The bottom wall 30 and the side wall 32 may be integrally constructed as a one-piece molded member. The side wall 32 terminates in a radially outward extending mounting flange 34 surrounding an open outer end 36.

A pair of surge ground conductors 40 and 42 have an end portion projecting over and seated on the mounting flange 34 and a leg portion extending inward along the sidewall 32 to an internal connection on the bottom wall 30 by one of the mounting screws used to attach the bottom wall 30 of the shell 26 to the base 24.

A plurality of bosses 44 are integrally formed on the bottom wall 30 and receive jaw blades, not shown.

The base 24 is in one aspect of the present invention shown in greater detail in FIGS. 4–10 formed as a latch base 24. The latch base 24 may also be formed as a one-piece, molded member of a suitable electrically insulating material, such as polycarbonate. The base 24 includes a bottom wall 50 and a stepped side wall denoted generally by reference number 52 which projects from an inner band 54 at the bottom wall 50 to stepped inner and outer annular ends 56 and 58, respectively.

The stepped ends 56 and 58 form a seat for receiving an edge of the bottom wall 30 of the shell 26. A plurality of apertures 58 are formed in the bottom wall 50 for receiving one end of the jaw blades, not shown, extending from the bottom wall 30 of the shell 26.

A plurality of mounting bosses 60 are circumferentially spaced about the bottom wall 50 and project from an enlarged diameter end 62 adjacent to the bottom wall 50 to an outer end substantially coplanar with the inner end 56 of the side wall 52. A bore 64 projects through each mounting boss 60 and may be threaded for receiving a threaded fastener, such as a screw, extending through one of the apertures in the bottom wall 30 of the shell 26 to fixedly secure the shell 26 to the base 24.

A plurality of mounting feet 70, such as four, for example, project from the outer surface of the bottom wall 50 of the base 24. One mounting foot 70 is disposed adjacent to the blade end of one jaw blade extending through one of the apertures 58 in the bottom wall 50.

A mounting flange 72 projects radially outward from the side wall 52 in the vicinity of the inner annular band 74. Frangible means 73 are optionally formed in the flange 72 in the form of one or more score lines to enable another edge portion of the flange 72 to be separated from the remainder of the flange 72. This enables a single diameter flange 72 to be molded; yet the flange 72 can be varied in diameter to adapt the base 24 for mounting on ring style or ringless style meter socket covers.

In one aspect of the present invention, the latch base 24 is provided with a conformable diameter means which includes a variable diameter sidewall 52 formed by a discontinuous or an irregular accordion shaped portion 76. The portion 76 is formed of at least one end, preferably a plurality of circumferentially extending sawtooth shaped ribs 78 defined by alternating outwardly extending projections 78 and recesses 80.

The portion 76 serves two functions. First, the portion 76 serves as a weep hole at the bottom of the latch base 24 to allow any liquid which may have inadvertently entered the latch base 24 to flow out from the latch base 24. Secondly, the accordion portion 76 provides a deformable side wall 52 to enable the diameter the side wall 52 to expand when engaged in the bottom wall 30 of the shell 26 to accommodate different diameter shell bases 30.

Figure 4:
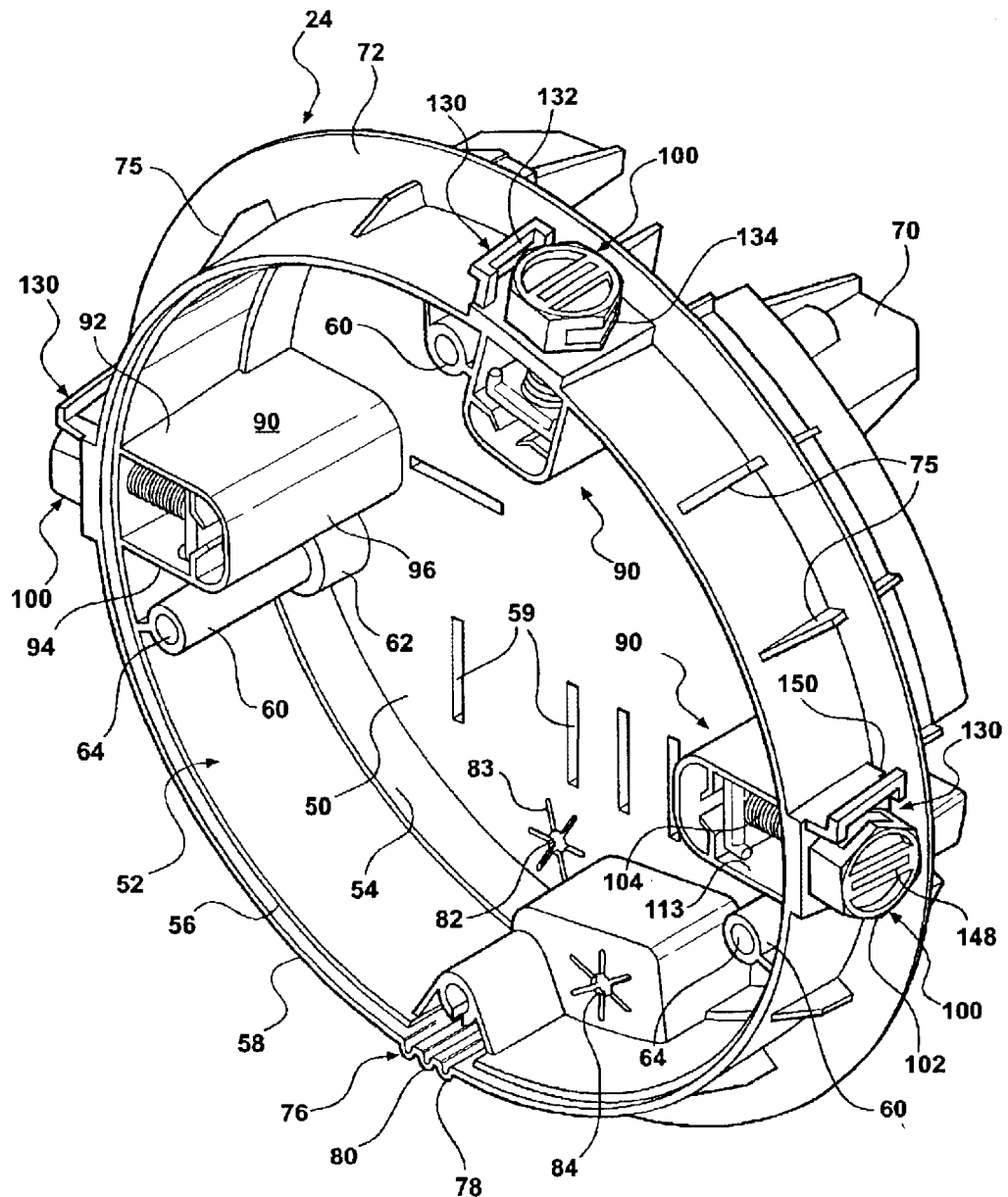
FIG. 4 is an enlarged perspective view of the base of the latch base socket extender adapter shown in FIG. 3.
Figure 5:
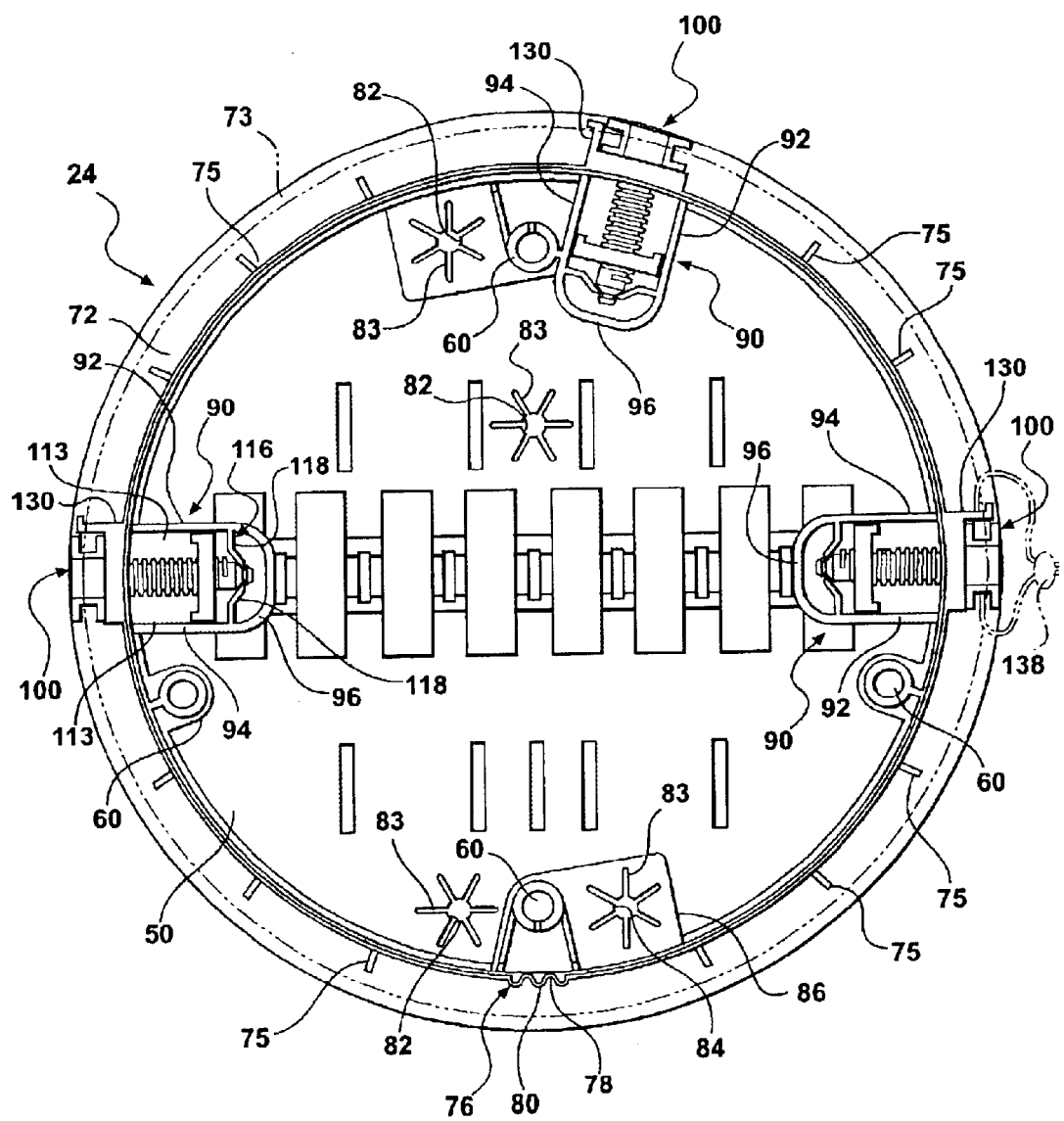
FIG. 5 is a front elevational view of the base shown in FIG. 4.

As clearly shown in FIGS. 4 and 5, at least one and preferably a plurality of apertures 82, with four apertures 82 being shown by way of example only, are formed in the bottom wall 50. Most of the apertures 82 are formed in the bottom wall 50 of the base 24 at spaced locations on the bottom wall 50. By example only, one of the apertures 84 is formed in an enlarged boss 86 adjacent one of the mounting bosses 60.

The apertures 82 and 84 may take any shape, with the illustrated circular shape being used for one or more conductors which can pass freely through the apertures 82 and 84. For larger diameter conductors, having a outer diameter larger than the diameter of the apertures 82 and 84, a plurality of score lines or perforations extending in a star shape, by example only, are formed in the solid portion of the base 60 surrounding and extending radially from each aperture 82 and 84 typically around the entire 360° circumference of each aperture 82 or 84. The score lines or perforations 83 are formed at a predetermined depth to allow a large diameter conductor to be forced through the aperture and the surrounding solid portion of the base 50 with sufficient force to separate the score lines 83 and to form the illustrated fingers between the separated slits in the base 50 allowing the conductor to pass freely through the now enlarged cross section area surrounding the aperture 82 or 84.

Figure 15:
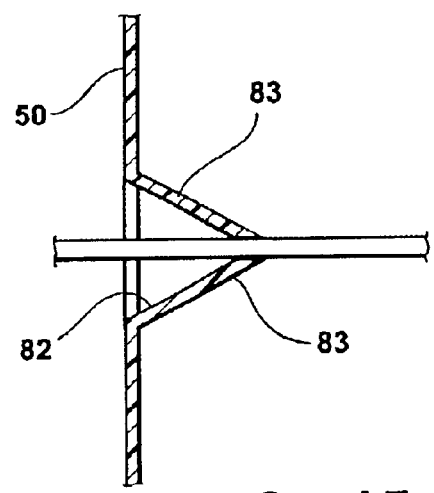
FIG. 15 is a partial cross sectional view through one of the base apertures showing the strain relief fingers relative to a pass through conductor.

The intervening, flexible solid portions when separated from the bottom wall 50 surrounding the aperture 82 or 84 serve as a strain relief for larger diameter conductors. The solid portions or fingers between the slits also prevent pullout of a conductor extending therethrough. The solid portions will be bent outward from the plane of the bottom wall 50 to an angle from the bottom wall 50 as shown in FIG. 15 to act as latch fingers having rigidity to resist movement of the conductor in a direction opposite from the insertion direction via the engagement of the ends of each solid portion with the outer surface of the conductor. This strain relief and lock function is shown in FIG. 15.

As shown in FIGS. 4–9, at least one and preferably a plurality of pockets or receptacles 90, with three pockets 90 being shown by way of example only, are carried in the latch base 24, preferably as an integral, one-piece, molded part of the base 24. The pockets 90 are circumferentially spaced, equidistantly about the sidewall 52 and project radially inward from the sidewall 52. Each pocket 90 has a generally U-shape formed of opposed sidewalls 92 and 94 extending radially inward from the sidewall 52 and an end wall 96 extending between the sidewalls 92 and 94 and radially spaced from the sidewall 52.

An important advantage accorded by the pockets 90 is that the sidewalls 92, 94 and the end wall 96 project substantially the full height of the sidewall 52 of the base 24 from the bottom wall 50 to the outer extent of the sidewall 52. This provides full arc protection between all sides of the conductive latch finger of the lock means described hereafter which is disposed within each pocket 90 and the adjacent electrically conductive jaw blades.

Figure 6:
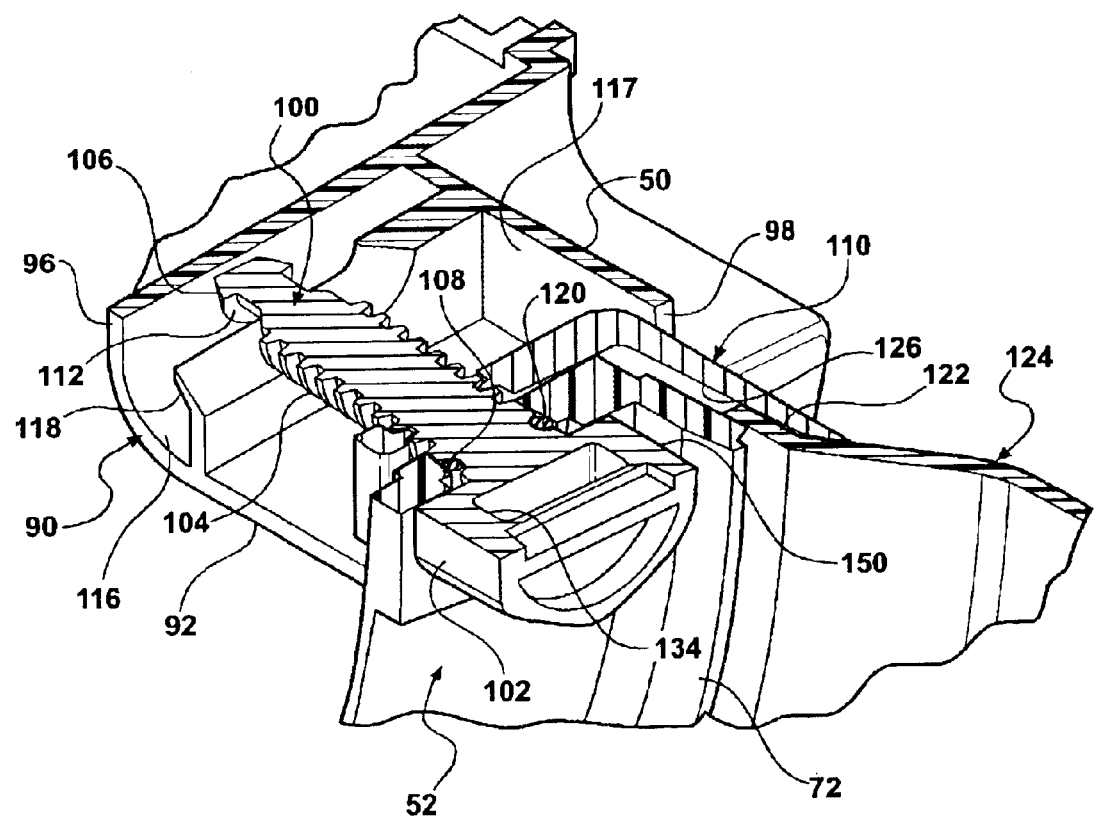
FIG. 6 is an enlarged, cross-sectional view through one of the latch drive members and the base shown in FIGS. 4 and 5.
Figure 7:
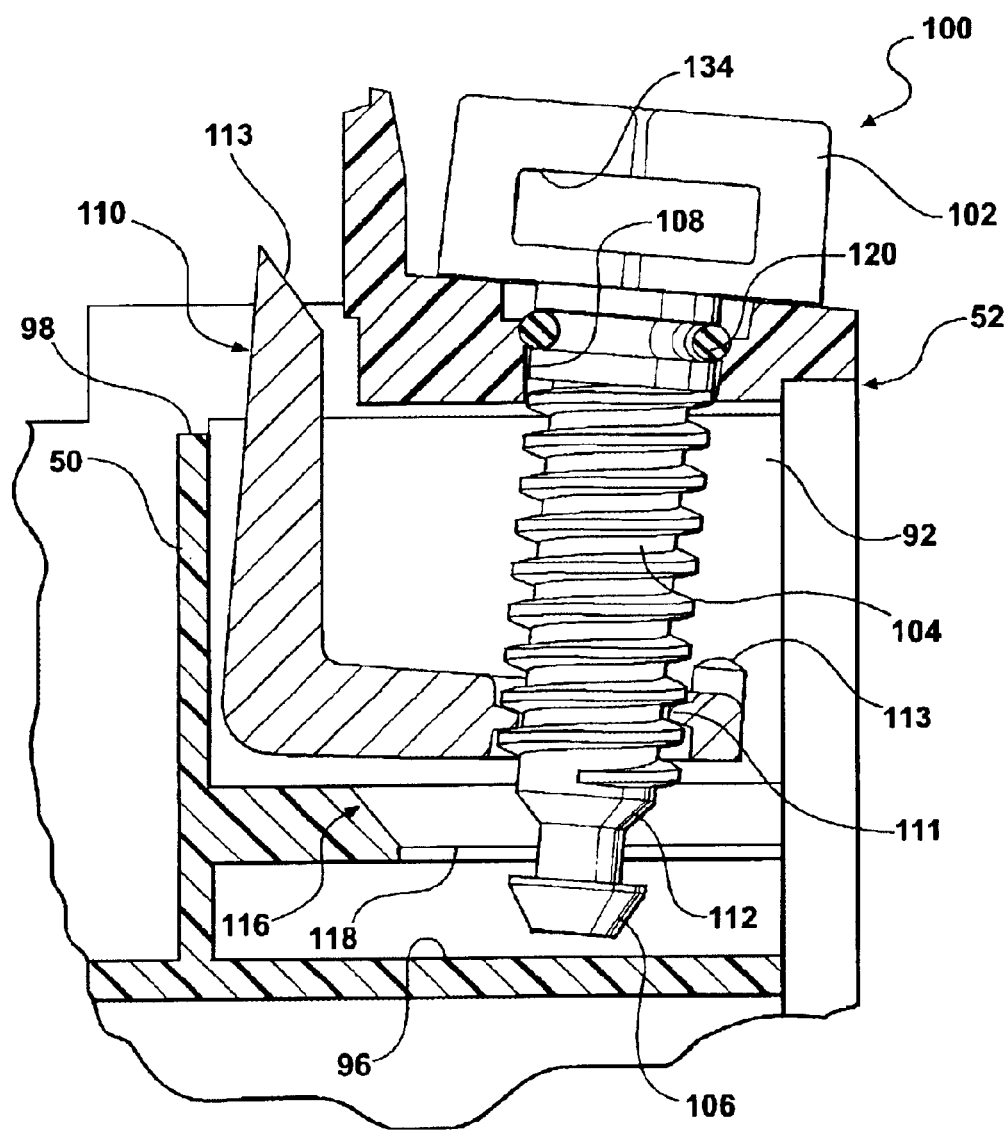
FIG. 7 is a plan elevational view, partly in cross section, of the latch drive member shown in FIG. 6.

As shown in FIGS. 6 and 7, one, and preferably a plurality (i.e., three) apertures or slots 98 is formed in the bottom wall 50 adjacent the sidewall 52 and one pocket 90 for the passage of one leg of one or a plurality of latch means therethrough, as described hereafter.

A threaded fastener 100 formed of an enlarged hex-head 102 and an externally threaded shank extending from the head 102 to an end 106 is disposed in each pocket 90. The shank 104 of each fastener 100 extends through an aperture 108 in the sidewall 52 to allow the threaded shank 104 to extend into the interior of the pocket 90.

As shown more clearly in FIG. 7, the aperture 108 is angularly offset from a nominal perpendicular extent through the sidewall 52 so as to dispose the axis of the aperture 108 as well as the longitudinal axis of the shank 104 of the fastener 100 at a predetermined, non-perpendicular angle with respect to the sidewall 52 of the latch base 10. The predetermined angle can vary and, by example only, is approximately 5°. This non-perpendicular angle disposes the shank 104 at an non-perpendicular angle with respect to the sidewall 52 to drive a latch means 110 threadingly moved by the fastener 100 into secure engagement with an inner surface 122 of the socket cover 124 shown in a ringless style cover shown in FIG. 6 by levertype action.

At least one, and preferably a pair of, bosses or projections 113 are carried on the leg of the latch means 110 through which the shank 104 threadingly extends. The bosses 110 engage the sidewall 52 on full outer positioning of the latch means 110 to lever the opposite end 115 of the latch means 110 into tighter engagement in the direction of arrow 117 with the surface of the socket cover 124.

The fasteners 100 may be formed of any suitable high strength material, such as metal or engineered or reinforced plastics with die-cast zinc being used for example. However, the latch means 110 is preferably formed of metal, such as brass, stainless steel, etc., to minimize corrosion.

As shown in FIGS. 4–9, an annular recess typically in the form of circular groove 112 is formed adjacent the end 106 of the shank 104 of each fastener 100.

A fastener latch means 116, preferably including at least two resilient, spaced latch arms 118, is integrally formed interiorly of each pocket 90. The latch arms 118 have spaced inward edges, with an optional annular edge, which are angularly disposed from an end portion of each latch arm 118 extending from an inner surface of the sidewall 92, 94 of each pocket 90. The angled inner ends extend away from the sidewall 52.

During initial insertion of each fastener 100 through the aperture 108 in the sidewall 52, the end 106 of each fastener 100 will engage and radially deflect the inner ends of the latch arms 118 outward from the longitudinal axis of the shank 104 of the fastener 100 until the enlarged head shaped end 106 passes through the inner ends of the latch arms 118 allowing the ends of the latch arms 118 to snap backward into the recess 112 adjacent the end 106 of the fastener 100 thereby axially locking the fastener 100 with respect to the pocket 110 while enabling the fastener 100 to rotate.

In this position, an O-ring 120 mounted in a recess adjacent the head 102 of each fastener 100 sealingly engages the inner surfaces of one aperture 108 in the sidewall 52 of the base 24 to seal each fastener 100 to the latch base to prevent the entry of water or debris along the shank 104 of each fastener 100 into the interior of the latch base 24. The seal 120 can optionally be mounted in the shoulder formed by the head 102 and shank 104.

As can be seen in FIGS. 6 and 7, rotation of each fastener 100 in one direction will cause the latch means 10 to axially move along the shank 104 of each fastener 100 by means of the thread 111 formed in the aperture of each latch means 110. This causes the end 113 of the latch means 110, which may be tapered or beveled, to move radially in and out with respect to the portion 122 of the socket cover 124 surrounding the opening 126 in the socket cover 124 through which the bottom portion of the latch base 24 extends. In the fully extended position of the latch means 110 shown in FIG. 6, the end 113 of the latch means 110 is fully engaged with the inner surface of the portion 122 of the socket cover 124 to securely lock the latch base 24 to the socket cover 124. Threading rotation of the fastener 100 in an opposite direction will cause the latch means 110 to axially traverse the shank 104 of the fastener 100 to an inboard position shown in FIG. 7 in which the end 113 of the latch means 110 is radially inward of the inner diameter of the aperture 126 in the socket cover 124 to allow the latch base 124 to be withdrawn through the aperture 126. This inboard position of the latch means 110 also defines an installation position enabling the end 113 of each latch means 110 to clear the inner diameter of the aperture 126 in the socket cover 124 to mount the latch base 24 in the socket cover 124.

According to another aspect of the present invention, at least one ear or flange 130 is carried on the sidewall 52 of the latch base 24, either through separate attachment to the sidewall 52 or by integral molding with the sidewall 52. Each ear 130 projections radially outward from the sidewall 52 and includes an aperture 132 opening toward the adjacent fastener head 102. A through bore 134 is formed in the head 102 of each fastener 100 so as to be alignable with the aperture 132 in the ear 130 when the fastener 100 is rotated to a position to drive the latch means 110 to the fully extended position shown in FIG. 6 locked behind the wall portion 122 of the socket cover 124. A padlock or wire seal 138, shown in phantom in FIG. 5, is insertable through the bore 134 and the aperture 132 to indicate a sealed position of the latch base 24 on the socket cover 124. Since the slots or apertures 134 and 132 ,are cast in the flange 130 and fastener head 102, manufacturing time is reduced as compared to the prior art ease of separate machining operation to make the apertures.

Figure 8:
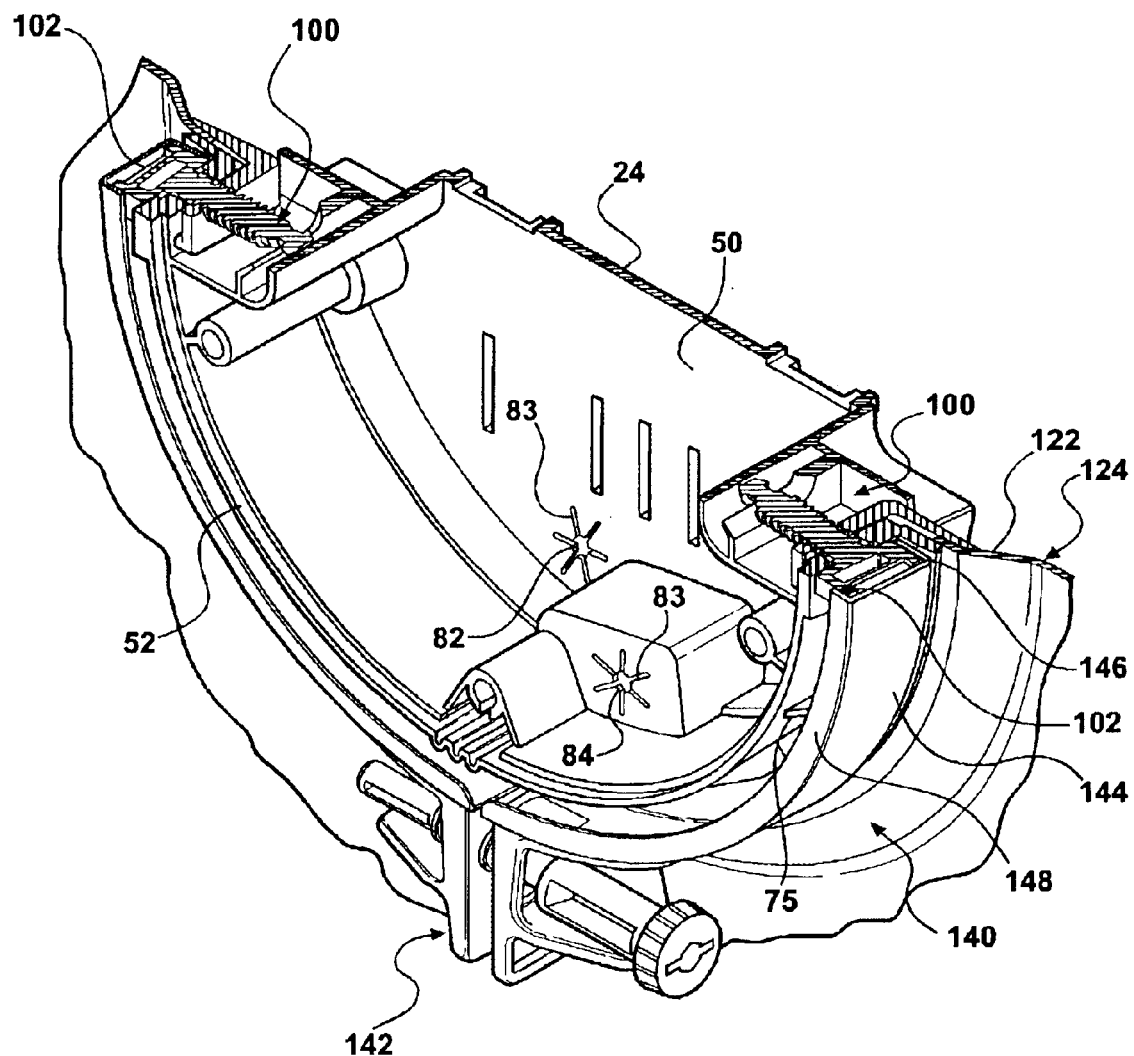
FIG. 8 is a partial perspective view showing the mounting of the latch base and a sealing ring on a ringless style meter socket cover.

Referring now to FIG. 8, there is depicted the use of the latch base 24 of the present invention with a sealing ring 140. The sealing ring 140 may be any type of sealing ring used in watthour meter/meter socket adapter applications to secure a watthour meter to a ring style socket cover, to secure a watthour meter to a watthour meter socket adapter, or to secure a watthour meter socket adapter to a ring style meter socket cover. By example, only the sealing ring 140 shown in FIG. 8 is the sealing ring disclosed in U.S. Pat. No. 5,851,038, Assigned to the assignee of the present invention.

The sealing ring 140 includes a lock mechanism 142 which lockingly secures separable ends of an annular band about the latch base 24. As shown in FIG. 8, the annular band of the sealing ring 140 includes a central wall 44 and two opposed outward projecting side walls 146 and 148. The width of the central wall 144 of the band of the sealing ring 140 is sized to fit about two diametrically opposed flats 101 of the hex-shaped head 102 of each fastener 100, with the side legs 144 and 146 extending over the flats of the head 102 when one flat 101 is aligned in parallel with the adjacent mounting flange 72. This uniquely prevents access to a tool or screwdriver receiving slot 148 formed in each head 102 as well as preventing an wrench or other tool from engaging the hex flats on the head 102. With the lock mechanism 142 fully engaged, the sealing ring 140 prevents detachment of the latch base 24 from the socket cover 124.

Figure 14:
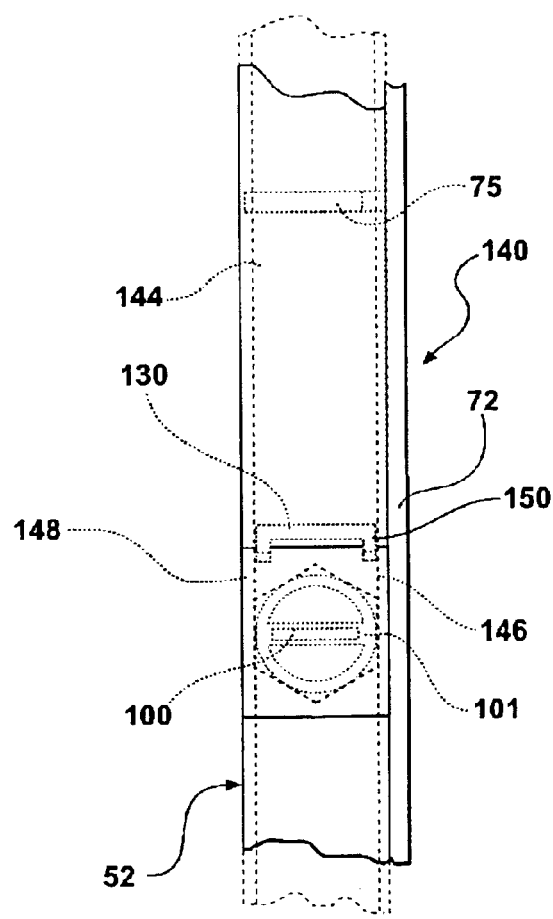
FIG. 14 is an enlarged plan view of the drive member, seal flange and sealing ring shown in FIG. 4.

As shown in detail in FIGS. 6 and 7, a notch or recess 150 is formed between the outer side edge of each flange 130 and the adjacent mounting flange 72 on the latch base 24. The recess 150 receives one of the side leg 146 of the sealing ring 140 thereby uniquely enabling the sealing ring 140 to be mounted for the first time over the heads 102 of the drive members 100. As shown in FIG. 14, when the sealing ring 140 is mounted in the recess or notch 150 between each flange 130 and the adjacent mounting flange 72, one side leg 146 of the sealing ring 140 will rest on the radially outermost, tapered surface of each rib 75 thereby radially centering the sealing ring over the head 102 of the drive members 100.

Figure 9:
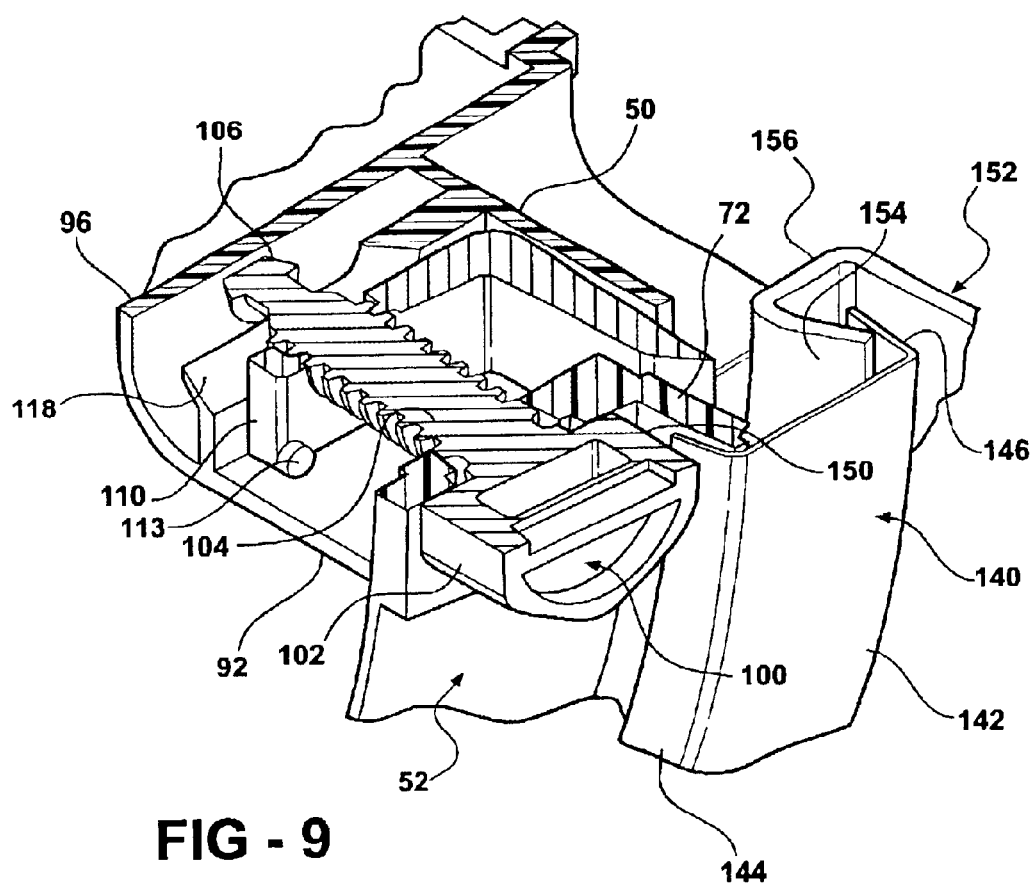
FIG. 9 is an enlarged, cross-sectional view showing the latch drive member and a sealing ring on a ring style meter socket cover.
Figure 10:
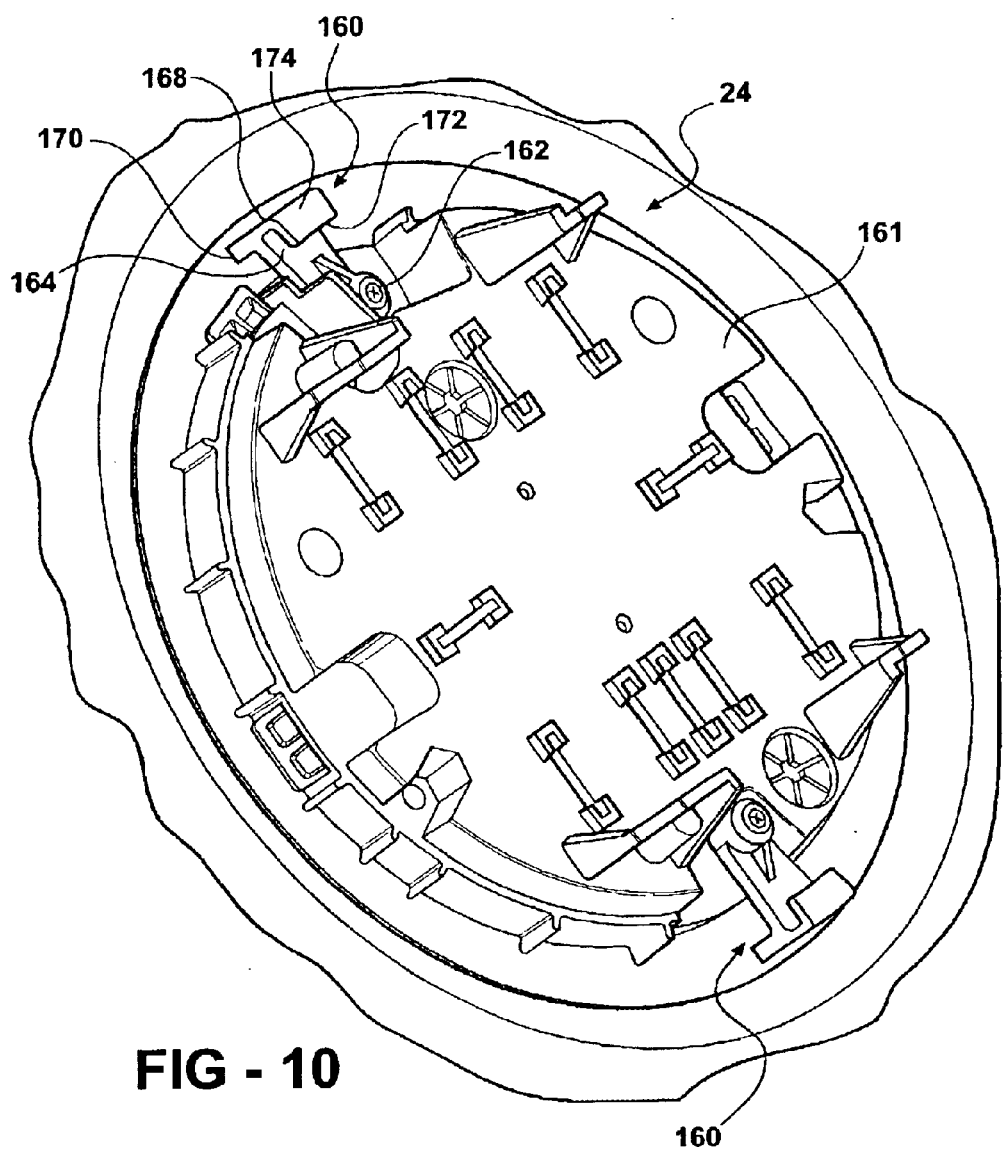
FIG. 10 is a perspective view of the rear surface of the latch base and depicting optional latch members shown in FIGS. 4 and 5.
Figure 11:
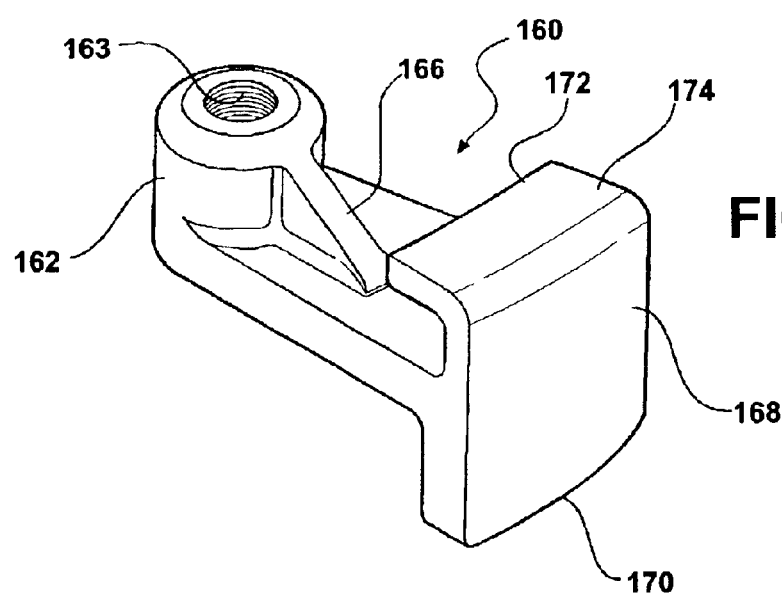
FIG. 11 is an enlarged, perspective view of the optional latch finger shown in FIG. 10.

Referring now to FIG. 9, there is depicted the use of the latch base 24 and the sealing ring 140 on a ring style meter socket cover 152 having a rolled out flange 154 defining an aperture 156 through which the latch base 24 is mounted. In this type of meter application, the side leg 144 of the sealing ring 140 is disposed in the recess 150 between the head 102 of each fastener 100 and the adjoining mounting flange 72 on the latch base 24. The opposite side leg 146 of the sealing ring 140 fits over and engages the flange 154 on the socket cover 152 such that the sealing ring 140 spans the mounting flanges 72 and 154 to sealingly mount the latch base 24 to the socket cover 152.

Referring now to FIGS. 10–13, there is depicted a different type of latch means used to mount the latch base 24 on a meter socket cover.

In this aspect of the invention, the latch means 160 includes at least one and preferably a plurality, such as two or more, latch members 160 carried in pockets. on the rear surface 162 of the latch base 24. It will be understood that the optional latch means 160 described hereafter may be used independently of the fasteners 100 and latch members 110 described above and shown in FIGS. 1–9 or in conjunction therewith.

Each latch member 160 is typically formed as a one piece member of molded plastic having a generally cylindrical base 162, and a generally planar arm 164 projecting from the base 162 and supported by an optional rib 166. The arm 164 terminates in a finger 168 having a first end 170 and an opposed second end 172 which is formed on a depending end portion 174 of the finger 168. A threaded bore 163 extends through the base 162.

Each latch member 160 is retracted in a pocket in the rear surface 161 of the bottom wall 50 of the latch base 24, with the bore 163 in each base 162 aligned with the bore 64 extending through one of the mounting bosses 60 projecting from the bottom wall 50 of the latch base 24. A fastener, such as fastener 180 which can be the same fastener used to secure the shell 26 to the latch base 24, is inserted through the bore 64 and the base 162 on one latch member 160 and secured in place by a nut 182. The head 184 of the screw 180 seats against a washer 186 disposed on the end of the mounting boss 64. The threaded bore 163 in the base 162 of each latch member 160 may be self tapping.

The latch members 160 may be formed of any suitable material, such as a glass reinforced plastic, by example only. The nuts 182 are conventional lock nuts having a nylon internal sleeve.

The self tapping threads in the bore 163 in the base 162 of each latch member 160 ensure that the latch member 160 remains in a fixed angular position on the fastener 180 so as to be rotatable with rotation of the fastener 180. An end portion of the nylon insert in the lock nut 182 acts as a bearing surface against one end of the base 162 of the latch member 160. This engagement allows the nut to be threaded and unthreaded relative to the fastener 180, while the latch member 160 remains in a fixed position on the fastener 180 after installation of a lock nut 182.

Figure 13:
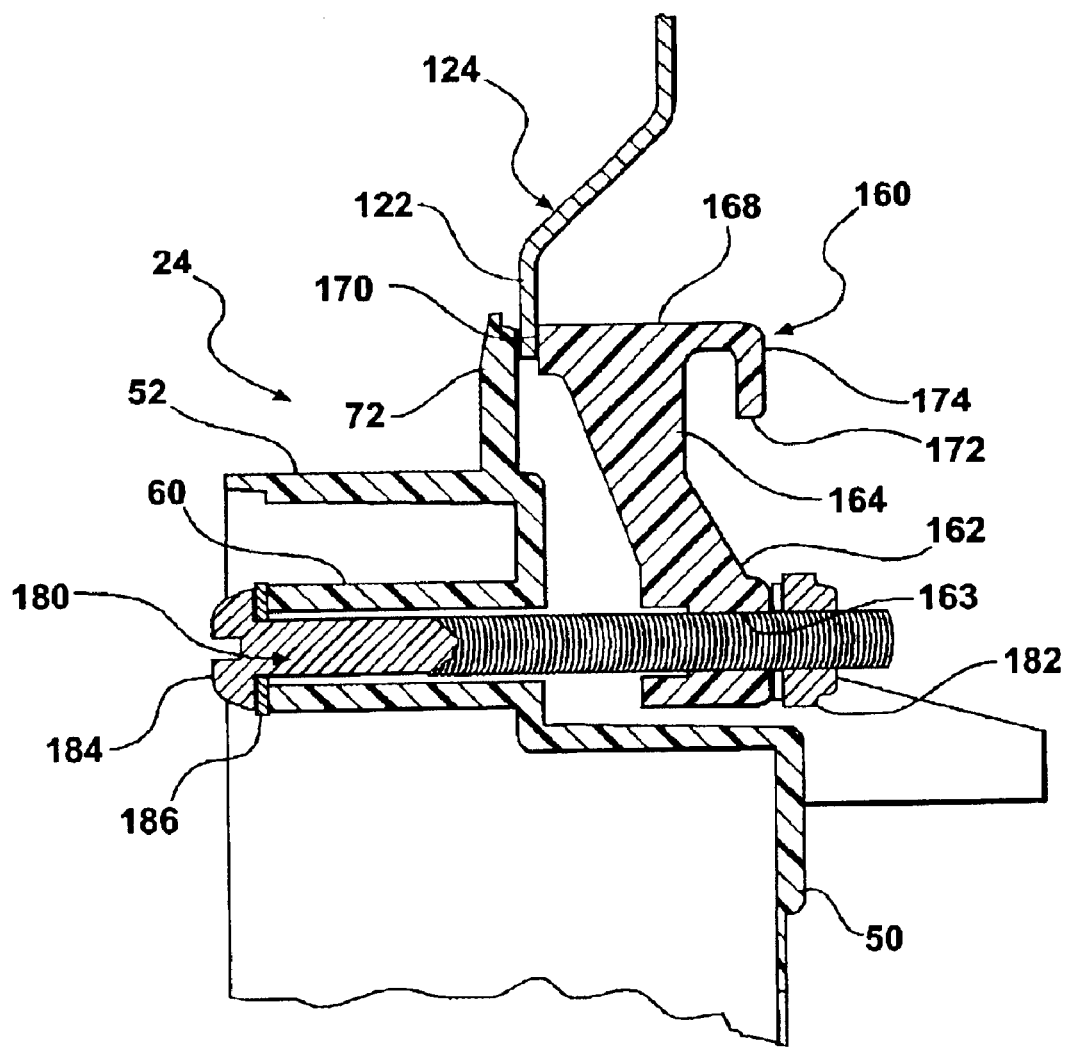
FIG. 13 is a side cross-sectional view showing the optional latch finger depicted in FIG. 11 with the latch base mounted on a ring style meter socket cover.

As shown in FIG. 13 for a ring style meter socket cover 152, the depending end portion 174 of the lock member 160 overhangs the mounting flange 154 on the meter socket cover 152 to lock the latch member 160 to the flange 154.

The opposite ends 72 of the finger 168 of each latch member 160 forcibly engages the rear surface of the mounting flange 72 on the latch base 24 to secure the latch base 24 to the meter socket cover 162.

Once the latch base 24 is mounted on the meter socket cover 152 by tightening the fasteners 180, access to the fasteners 180 may be had only by removal of the metering device mounted in the latch base 24 to effect removal of the latch base 24 from the meter socket cover 152.

In FIG. 13, one of the latch members 160 is shown engaged with the end portion 122 of a ring style meter socket cover 124 through engagement of the end 170 of the latch member 160 with the rear surface of the edge of the end portion 122 of the ring style socket cover 124.

Figure 12:
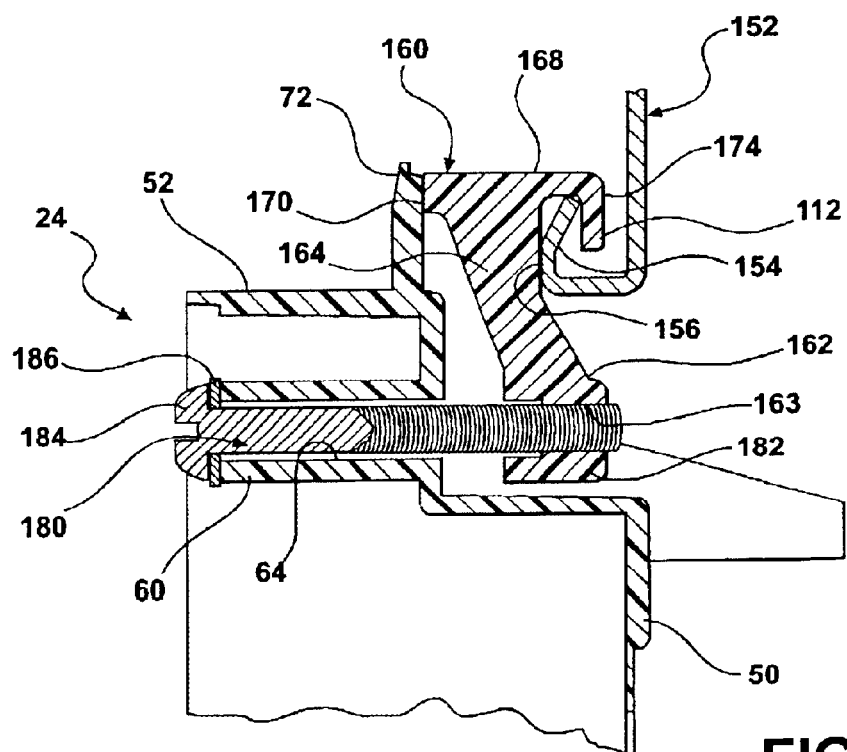
FIG. 12 is a side cross-sectional view showing the mounting arrangement between the latch finger shown in FIG. 11, and the latch base on a ring style meter socket cover.

In both applications shown in FIGS. 12 and 13, the fasteners 180 may be rotated in either direction to rotate the latch member 160 a sufficient angular distance to enable the finger 168 of each latch member 160 to drop below the adjoining surface 122 of the meter socket cover 124 or the flange 154 of the meter socket cover 152 to enable the latch base 24 to be removed from or mounted in the aperture in the respective meter socket covers 124 or 152.

As best shown in FIG. 13, the end 174 of the latch member 160 can serve as a hanger due to the depending end 172 to enable the entire adapter 20 to be temporarily hung during installation from the mounting flange on a ring-style socket cover or from the edge of the opening in a ringless style socket cover.

Alternately, a single latch 160 can be provided at a lower end of the adapter 20 and a projection or hook at an opposed or upper end. The projection engages an inner edge of the socket cover, with the latch 160 used to releasably mount the latch base 24 to the socket cover.

It will also be understood that certain of the above-identified features of the present invention as usable in a more conventional ringless or ring style mounted watthour meter socket adapter having a housing formed of a separate base and shell which are joined together by fasteners, in addition to the use of such features on the above-described latch base socket adapter.

For example, a conventional watthour meter socket adapter with a separately joinable base and shell may utilize the conformable means 80 described on the annular ring of the base as described above and shown in FIG. 5.

The base of such a socket adapter may also include the frangible means 73 in the form of a frangible outer portion of the base flange to enable the base to be convertible from ring style to ringless style meter socket cover mounting.

The apertures with 82 with strain relief features 83 described above and shown in FIG. 5 may also be employed in a conventional watthour meter socket adapter base to enable easy passable of conductors from a watthour meter through the socket adapter base. The strain relief fingers not only provide strain relief for such conductors but also provide a locking feature preventing unintended withdrawal of the conductors through the base.

Finally, the optional latches 160 shown in FIGS. 10–13 may also be employed on a conventional base to provide means for mounting the base on a ring style or ringless style socket covers.

In summary, there has been disclosed a watthour meter socket adapter with a unique latch base which can be easily and securely mounted in either ring style or ringless style meter socket covers to enable recording, surveying and other metering equipment to be mounted to a meter socket cover. Also disclosed in a watthour meter socket adapter with a base and shell for receiving a watthour meter which has numerous improvements for ease of use and reduced manufacturing cost.

What is claimed is:

1. An electrical power service apparatus mountable in a meter socket having a cover with an aperture, the electrical power service apparatus comprising:
   a housing with a base and a flange extending radially outward from the base;
   an annular ring extending from the base;
   a plurality of drive members radially extendible through the ring; and
   a latch coupled to each drive member for movement into engagement with a meter socket cover adjacent to an aperture in the cover.

2. The apparatus of claim 1 further comprising:
   frangible means, formed in the housing flange, for separating an outer ring portion from the flange.

3. The apparatus of claim 1 further comprising:
   trap members carried on the barrier means for axially capturing the drive members for rotation with respect to the annular ring.

4. The apparatus of claim 1 further comprising:
   an ear carried and extending radially outward from the annular ring on the housing;
   an aperture formed in the ear,
   an aperture formed in a portion of the drive member disposed radially exteriorly of the annular ring; and
   tamper indicator seal means, extendible through the apertures in the ear and the drive member, for indicating a sealed position of the drive member.

5. The apparatus of claim 1 further comprising:
   a seal member carried on each drive member for environmentally sealing each drive member to the annular ring.

6. The apparatus of claim 6 further comprising:
   an annular recess carried on each drive member, the seal member mounted in the recess.

7. The apparatus of claim 1 further comprising:
   an ear carried and extending radially outward from the annular ring on the housing;
   one side of the ear spaced from the flange on the housing and defining a recess with respect to the flange on the housing; and
   a sealing ring having a central wall and two outward projecting sidewalls, one sidewall insertable into the recess.

8. The apparatus of claim 7 further comprising:
   a plurality of ribs carried on the annular ring on the housing, the ribs engagable with a sealing ring mountable about the annular ring to center the sealing ring with respect to the annular housing.

9. The apparatus of claim 1 wherein the drive members comprise:
   a die cast metal fastener having a threaded shank and an enlarged head.

10. The apparatus of claim 9 wherein:
    the head of each threaded fastener has a plurality of angularly disposed peripheral flats, at least one of the peripheral flats alignable with the flange extending radially outward from the base to receive a sealing ring over the head of each threaded fastener.

11. The apparatus of claim 1 further comprising:
    at least one aperture extending through the base of the housing; and
    a plurality of perforations formed in the base and extending from the aperture, the perforations separable from the base to form a plurality of fingers having a free end at the aperture, the fingers forming a strain relief for an electrical conductor passing through the aperture.

12. The apparatus of claim 11 wherein:
    the fingers having an apex edge, the fingers bendable from a plane of the base to lock an electrical conductor extending through the aperture from withdrawal from the aperture.

13. The apparatus of claim 12 wherein:
    the fingers are bendable out of the plane of the base to enlarge the diameter of the aperture in the base.

14. The apparatus of claim 1 further comprising:
    at least one latch member carried on the base of the housing and movable between a first retracted position allowing insertion of the housing through an aperture in the socket cover and second extended position fixedly latching the housing to the cover.

15. The apparatus of claim 14 further comprising:
    a fastener extendible through the housing and one latch member; and
    wherein
    rotation of the fastener moves the one latch member between the first and second positions.

16. The apparatus of claim 15 further comprising:
    a shell mountable to the mounting flange on the housing, the fastener securing the shell to the base of the housing and extending through the base of the housing.

17. The apparatus of claim 1 further comprising:
    frangible means, formed on the flange of the housing, for varying the diameter of the mounting flange.

18. The apparatus of claim 17 wherein the frangible means comprises:
    a separable outer annular ring carried on the flange.

19. The apparatus of claim 17 wherein the frangible means comprises:
    a plurality of shallow recesses formed in the flange.

20. The apparatus of claim 1 further comprising:
    barrier means, disposed in the housing, for electrically insulating each drive member from adjacent electrically conductive elements in the housing, the barrier means disposed about substantially all sides of the drive member with respect to the base.

21. The apparatus of claim 20 wherein:
    the barrier means extends from the base of the housing substantially to the outer edge of the annular ring.

22. The apparatus of claim 20 wherein the barrier means comprises:
    a continuous wall.

23. The apparatus of claim 22 wherein:
    the wall is integrally formed with the base in the housing.

24. The apparatus of claim 1 further comprising:
    conformable means, carried on the annular ring for adjusting the engagement of the ring with a shell attachable to the housing.

25. The apparatus of claim 24 further comprising:
    at least one aperture extending through the base of the housing; and a plurality of perforations formed in the base and extending from the aperture, the perforations separable from the base to form a plurality of fingers having a free end at the aperture, the fingers forming a strain relief for an electrical conductor passing through the aperture.

26. The apparatus of claim 25 wherein:

the fingers having an apex edge, the fingers bendable from a plane of the base to lock an electrical conductor extending through the aperture from withdrawal from the aperture.

27. The apparatus of claim 26 wherein:

the fingers are bendable out of the plane of the base to enlarge the diameter of the aperture in the base.

28. The apparatus of claim 24 wherein the conformable means comprises:

at least one annular discontinuity in the annular ring.

29. The apparatus of claim 28 wherein the at least one angular discontinuity comprises:

a plurality of angular discontinuities in the annular ring.

30. The apparatus of claim 28 wherein the at least one angular discontinuity comprises:

a sawtooth shaped discontinuity in the annular ring.

31. The apparatus of claim 24 further comprising:

frangible means, formed on the flange of the housing, for varying the diameter of the mounting flange.

32. The apparatus of claim 31 wherein the frangible means comprises:

a separable outer annular ring carried on the flange.

33. The apparatus of claim 31 wherein the frangible means comprises:

a plurality of shallow recesses formed in the flange.

34. The apparatus of claim 1 further comprising:

trap members carried in the housing for axially capturing the drive members for rotation with respect to the annular ring.

35. The apparatus of claim 34 further comprising:

one edge of the flange spaced from the flange on the housing and defining a recess; and a sealing ring having a central wall and two outward projecting sidewalls, one sidewall insertable into the recess when the sealing ring is mounted over the flange and one drive member.

36. The apparatus of claim 34 wherein:

each of the trap members includes a wall extending from the housing and having an edge angled with respect to a longitudinal axis of the drive member;

a recess carried on each drive member; and the edge of the wall cooperating with the recess to prevent axial displacement of the drive member during rotation of the drive member.

37. The apparatus of claim 36 further comprising:

a flange carried and extending radially outward from the annular ring on the housing.

38. The apparatus of claim 34 further comprising:

barrier means, disposed in the housing, for electrically insulating each drive member from adjacent electrically conductive elements in the housing, the barrier means disposed on substantially all sides of the drive member with respect to the base.

39. The apparatus of claim 38 wherein:

the barrier means extends from the base of the housing substantially to the outer edge of the annular ring.

40. The apparatus of claim 38 wherein the barrier means comprises:

a continuous wall.

41. The apparatus of claim 40 wherein:

the wall is integrally formed with the base in the housing.

42. An electrical service apparatus mountable to a watthour meter socket and carrying jaw blades engagable with jaw contacts in the watthour meter socket, the apparatus comprising:

a base;

a sidewall extending axially from the base; and conformable means carried on an end of the sidewall for adjusting, the an engagement of the sidewall with a shell attachable to the sidewall.

43. An electrical service apparatus mountable to a watthour meter socket and carrying jaw blades engagable with jaw contacts in the watthour meter socket, the apparatus comprising:

a base;

a sidewall extending axially from the base; and a plurality of ribs carried on the sidewall, the ribs engagable with a sealing ring mountable about the sidewall to center the sealing ring with respect to the sidewall.

44. An electrical power service apparatus mountable in a meter socket having a cover with an aperture, the electrical power service apparatus comprising:

a housing with a base and a flange extending radially outward from the base;

an annular ring extending from the base;

a plurality of drive members radially extendible through the ring;

a latch coupled to each drive member for movement into engagement with a meter socket cover adjacent to an aperture in the cover;

a plurality of trap members carried in the housing for axially capturing the drive members for rotation with respect to the annular ring, each of the trap members including:

a wall extending from the housing and having an edge angled with respect to a longitudinal axis of the drive member;

a recess carried on each drive member; and the edge of the wall cooperating with the recess to prevent axial displacement of the drive member during rotation of the drive member.

45. An electrical service apparatus mountable to a watthour meter socket and carrying jaw blades engagable with jaw contacts in the watthour meter socket, the apparatus comprising:

a base;

at least one aperture extending through the base of a housing; and a plurality of perforations formed in the base and extending from the aperture, the perforations separable from the base to form a plurality of fingers having a free end at the aperture, the fingers forming a strain relief for an electrical conductor passing through the aperture.

46. The apparatus of claim 45 wherein:

the fingers having an apex edge, the fingers bendable from a plane of the base to lock an electrical conductor extending through the aperture from withdrawal from the aperture.

47. The apparatus of claim 46 wherein:

the fingers are bendable out of the plane of the base to enlarge the diameter of the aperture in the base.

48. An electrical service apparatus mountable to a watthour meter socket and carrying jaw blades engagable with jaw contacts in the watthour meter socket, the apparatus comprising:

a base;

a sidewall extending axially from the base;

a mounting flange extending radially from at least one of the base and the sidewall adapted to be engagable with a watthour meter socket cover; and frangible means, formed on the flange, for varying the diameter of the flange.

49. The apparatus of claim 48 wherein the frangible means comprises:

a separable outer annular ring carried on the housing.

50. The apparatus of claim 48 wherein the frangible means comprises:

a plurality of shallow recesses formed in the flange.

51. An electrical power service apparatus mountable in a meter socket having a cover with an aperture, the electrical power service apparatus, the apparatus comprising:

a housing with a base and a flange extending radially outward from the base;

an annular ring extending from the base and carrying a mounting flange at one end;

the base having an interior surface concentrically within the mounting flange and an opposed outer surface; and a plurality of pivotal latch members carried on the outer surface of the housing and pivotal between a first retracted position allowing insertion of the housing through an aperture in the meter socket cover and second extended position fixedly latching the housing to the cover.

52. The apparatus of claim 51 wherein the conformable means comprises:

at least one annular discontinuity in the annular ring.

53. The apparatus of claim 52 wherein the at least one angular discontinuity comprises:

a plurality of angular discontinuities in the annular ring.

54. The apparatus of claim 52 wherein the at least one angular discontinuity comprises:

a sawtooth shaped discontinuity in the annular ring.

55. An electrical power service apparatus mountable in a meter socket having a cover with an aperture, the electrical power service apparatus comprising:

a housing with a base and a flange extending radially outward from the base;

an annular ring extending from the base;

a plurality of drive members radially extendible through the ring;

a latch coupled to each drive member for movement into engagement with a meter socket cover adjacent to an aperture in the cover; and barrier means, disposed in the housing, for electrically insulating each drive member from adjacent electrically conductive elements in the housing, the barrier means disposed about substantially all sides of the drive member with respect to the base.

56. The apparatus of claim 55 wherein:

the barrier means extends from the base of the housing substantially to the outer edge of the annular ring.

57. The apparatus of claim 55 further comprising:

trap members carried on the barrier means for axially capturing the drive members for rotation with respect to the annular ring.

58. The apparatus of claim 55 wherein the barrier means comprises:

a continuous wall.

59. The apparatus of claim 58 wherein:

the wall is integrally formed with the base in the housing.

60. An electrical service apparatus mountable to a watthour meter socket and carrying jaw blades engagable with jaw contacts in the watthour meter socket, the apparatus comprising:

a housing with a base and a flange extending radially outward from the base;

an annular ring extending from the base;

a plurality of drive members radially extendible through the ring;

a latch coupled to each drive member for movement into engagement with a meter socket cover adjacent to an aperture in the cover;

an ear carried and extending radially outward from the annular ring on the housing;

one side of the ear spaced from the flange on the housing and defining a recess with respect to the flange on the housing; and a sealing ring having a central wall and two outward projecting sidewalls, one sidewall insertable into the recess.

61. The apparatus of claim 60 further comprising:

an aperture formed in the ear;

an aperture formed in a portion of the drive member disposed radially exteriorly of the annular ring; and tamper indicator seal means, extendible through the apertures in the ear and the drive member, for indicating a sealed position of the drive member.

62. The apparatus of claim 60 wherein:

the drive members are formed of a threaded fastener having a threaded shank and a head, the head of each fastener having hex peripheral flats; and at least one of the flats on the head of each fastener alignable with the flange on the housing to enable one side wall of the sealing ring to be disposed in the recess; and the sidewall of the sealing ring in the recess blocking substantial rotation of the fastener.

63. The apparatus of claim 62 wherein:

the sealing ring is mounted over the ear and the drive member.

64. The apparatus of claim 62 wherein:

the sealing ring is mounted over the flange of the housing and a portion of a watthour meter socket cover.

* * * * *

UNITED STATES PATENT AND TRADEMARK OFFICE
CERTIFICATE OF CORRECTION

PATENT NO.     : 6,752,652 B1
DATED          : June 22, 2004
INVENTOR(S)    : Robinson It is certified that error appears in the above-identified patent and that said Letters Patent is hereby corrected as shown below:

Column 13,
Line 26, replace "1" with -- 20 --.

Column 17,
Line 35, replace "51" with -- 42 --.

Signed and Sealed this

Twenty-third Day of August, 2005

JON W. DUDAS
*Director of the United States Patent and Trademark Office*